(12) United States Patent
He et al.

(10) Patent No.: US 11,503,740 B2
(45) Date of Patent: Nov. 15, 2022

(54) COOLING SYSTEM FOR AN INFORMATION HANDLING SYSTEM

(71) Applicant: Dell Products L.P., Round Rock, TX (US)

(72) Inventors: Qinghong He, Austin, TX (US); Patrick Hampton, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/172,749

(22) Filed: Feb. 10, 2021

(65) Prior Publication Data

US 2022/0256738 A1 Aug. 11, 2022

(51) Int. Cl.
*H05K 7/20* (2006.01)
*G06F 1/20* (2006.01)

(52) U.S. Cl.
CPC ......... *H05K 7/20336* (2013.01); *G06F 1/203* (2013.01); *H05K 7/2039* (2013.01); *H05K 7/20172* (2013.01)

(58) Field of Classification Search
CPC .......... H05K 7/20336; H05K 7/20172; H05K 7/2039; H05K 7/20154; H05K 7/20145; H05K 7/20727; H05K 7/20809; H05K 7/20136; H05K 7/20; H05K 7/20818; H05K 7/20009; H05K 7/20718; H05K 7/20736; G06F 1/203; G06F 1/20; G06F 1/206; G06F 2200/201; F28D 2021/0028; F28D 15/0275; F28D 1/024; H01L 23/427; H01L 23/36
See application file for complete search history.

(56) References Cited

U.S. PATENT DOCUMENTS

| | | | | | |
|---|---|---|---|---|---|
| 5,986,882 | A * | 11/1999 | Ekrot | ................. | H05K 7/20809 361/679.48 |
| 6,115,252 | A * | 9/2000 | Ohta | ................... | F28D 15/0233 361/689 |
| 6,373,700 | B1 * | 4/2002 | Wang | ................... | H01L 23/467 361/679.48 |
| 6,415,612 | B1 * | 7/2002 | Pokharna | ................ | H01L 23/38 62/3.2 |
| 7,660,119 | B2 * | 2/2010 | Iikubo | ....................... | G06F 1/20 165/80.5 |
| 7,688,587 | B2 * | 3/2010 | Ishikawa | ............. | H01L 23/4006 361/698 |
| 9,295,180 | B2 * | 3/2016 | Lu | ....................... | H05K 7/20172 |
| 10,856,441 | B1 * | 12/2020 | Huang | ............... | H05K 7/20727 |

(Continued)

*Primary Examiner* — Michael A Matey
(74) *Attorney, Agent, or Firm* — Norton Rose Fulbright US LLP

(57) ABSTRACT

An information handling system having a heat exchanger positioned near and in thermally-conductive conduct with an electrical, heat-generating component of the information handling system, such as a central processing unit or graphics processing unit. A fan directs air across the heat exchanger to cool the electrical component by convection. A first portion of the heat pipe may be in direct physical contact with the electrical component and a second portion of the heat pipe may be in thermal contact with the electrical component and the first portion and in direct physical contact with an additional heat exchanger. The fan may direct air across both heat exchangers to cool the electrical component.

20 Claims, 7 Drawing Sheets

(56) References Cited

U.S. PATENT DOCUMENTS

| | | | | |
|---|---|---|---|---|
| 2004/0105233 A1* | 6/2004 | Lai | H05K 7/202 | 361/695 |
| 2004/0114328 A1* | 6/2004 | Chiou | G06F 1/203 | 361/697 |
| 2005/0103480 A1* | 5/2005 | Pokharna | F28F 13/003 | 257/E23.098 |
| 2006/0012955 A1* | 1/2006 | Vinson | H05K 7/20727 | 361/695 |
| 2006/0144573 A1* | 7/2006 | Nitta | H01L 23/467 | 165/104.33 |
| 2006/0232934 A1* | 10/2006 | Kusamoto | G06F 1/203 | 361/679.47 |
| 2008/0043428 A1* | 2/2008 | Ali | G06F 1/203 | 361/679.52 |
| 2008/0257529 A1* | 10/2008 | Fujiwara | H01L 23/427 | 257/E23.088 |
| 2009/0056911 A1* | 3/2009 | Hongo | H01L 23/427 | 165/80.4 |
| 2009/0324403 A1* | 12/2009 | Zheng | F04D 25/0613 | 415/203 |
| 2010/0061052 A1* | 3/2010 | Chung | G06F 1/20 | 361/679.47 |
| 2010/0124012 A1* | 5/2010 | Kondo | H05K 7/20818 | 361/679.47 |
| 2010/0139895 A1* | 6/2010 | Hwang | H01L 23/427 | 165/104.26 |
| 2011/0164384 A1* | 7/2011 | Vogel | F28D 1/024 | 165/122 |
| 2011/0192572 A1* | 8/2011 | Tsai | H01L 23/473 | 165/104.19 |
| 2011/0292608 A1* | 12/2011 | Tan | H01L 23/467 | 361/696 |
| 2011/0308776 A1* | 12/2011 | Huang | H01L 23/3672 | 165/121 |
| 2011/0310557 A1* | 12/2011 | Ooe | G06F 1/20 | 361/692 |
| 2011/0310561 A1* | 12/2011 | Hata | H05K 7/20154 | 361/720 |
| 2012/0106082 A1* | 5/2012 | Wu | G06F 1/203 | 361/695 |
| 2012/0170207 A1* | 7/2012 | Li | G06F 1/203 | 361/679.46 |
| 2012/0194995 A1* | 8/2012 | Wang | G06F 1/203 | 361/679.47 |
| 2013/0083253 A1* | 4/2013 | Maeshima | H04N 5/64 | 348/739 |
| 2013/0141869 A1* | 6/2013 | Lin | G06F 1/20 | 361/697 |
| 2013/0168058 A1* | 7/2013 | Chamseddine | F28D 7/0075 | 165/104.26 |
| 2013/0194744 A1* | 8/2013 | Chen | H01L 23/467 | 361/679.47 |
| 2013/0279112 A1* | 10/2013 | Kim | H05K 7/20154 | 361/692 |
| 2013/0327507 A1* | 12/2013 | Degner | G06F 1/203 | 165/120 |
| 2014/0041827 A1* | 2/2014 | Giaimo, III | G06F 1/20 | 165/11.1 |
| 2014/0090819 A1* | 4/2014 | Lin | H01L 23/373 | 165/121 |
| 2014/0268553 A1* | 9/2014 | Van Pelt | H01L 23/427 | 361/679.52 |
| 2015/0043148 A1* | 2/2015 | Zhang | H05K 7/20727 | 361/679.32 |
| 2015/0116928 A1* | 4/2015 | Delano | H01L 23/467 | 361/679.47 |
| 2015/0212556 A1* | 7/2015 | Hrehor, Jr. | H05K 7/20809 | 361/679.48 |
| 2016/0037683 A1* | 2/2016 | Tamaoka | H01L 23/467 | 165/104.21 |
| 2016/0165751 A1* | 6/2016 | Varadarajan | H05K 7/20136 | 165/80.2 |
| 2016/0254643 A1* | 9/2016 | Takigawa | H01S 5/02407 | 372/34 |
| 2018/0088637 A1* | 3/2018 | Uchino | G06F 1/16 | |
| 2018/0166057 A1* | 6/2018 | Jung | G06F 1/203 | |
| 2020/0081505 A1* | 3/2020 | Ma | H05K 7/20336 | |
| 2021/0072805 A1* | 3/2021 | He | G06F 1/203 | |
| 2021/0153382 A1* | 5/2021 | Saroor | H05K 5/0213 | |
| 2021/0219457 A1* | 7/2021 | Wong | H05K 7/20145 | |

\* cited by examiner

COOLING SYSTEM FOR AN INFORMATION HANDLING SYSTEM

FIELD OF THE DISCLOSURE

The instant disclosure relates to information handling systems. More specifically, portions of this disclosure relate to a cooling system for an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Within the field of information handling systems, there is an ever increasing demand for increased capability of information handling system components, including, for example, electrical components providing better processing speed, connectivity, graphics, and displays. More powerful electrical components often generate more heat as a by-product of their increased performance and consequently demand more powerful thermal dissipation solutions to prevent the electrical components from over-heating. Electrical components are often positioned within an enclosed chassis that traps their generated heat, decreasing the heat transfer coefficient between electrical components (which generate heat), such as central processing units and graphics processing units, and other, non-heat-generating components, such as the information handling system chassis and/or a heat pipe. Traditionally, the electrical components generating the most heat, such as central processing units or graphics processing units, are coupled to a heat pipe that transfers some of the generated heat to a heat exchanger near a fan. The fan then directs air across the heat exchanger to increase the heat transfer coefficient between the heat exchanger and the air. The heated air is discharged from the system and the process repeats. Accordingly, the amount of heat that electrical components may generate (and therefore also the performance of such components) is limited by the heat transfer rate across such a heat exchanger. When the capability of an information handling system is constrained by this transfer rate, the information handling system is considered "temperature junction" or "TJ" limited. The capability of some information handling systems, such as those with chasses routinely handled by a user, like tablets, may alternatively be constrained by the thermal transfer rate between the outer surfaces of the information handling system chassis and the environment outside the chassis. Such systems are considered "skin" limited.

Shortcomings mentioned here are only representative and are included to highlight problems that the inventors have identified with respect to existing information handling systems and sought to improve upon. Aspects of the information handling systems described below may address some or all of the shortcomings as well as others known in the art. Aspects of the improved information handling systems described below may present other benefits than, and be used in other applications than, those described above.

SUMMARY

Within an information handling system chassis, a second fan and/or a fan with a second outlet, such as a dual opposite outlet fan, may be used to provide airflow directly across components of the information handling system, including electrical (i.e., heat-generating) components such as the CPU and/or GPU, and non-heat-generating components such as the chassis. This additional airflow will efficiently increase the heat transfer rate between such components and the air, thereby cooling these components. The heated air is discharged from the system and the process repeats. In systems that are skin limited, such additional airflow may be sufficient to prevent reaching the skin limit. In systems that are TJ limited, an additional heat exchanger, such as a fin stack, may be positioned on the heat pipe adjacent to electrical components, such as a CPU and/or GPU. The heat exchanger increases the area of heat transfer between such components and the air. As air flowing from the second fan and/or fan with a second outlet flows across the additional heat exchanger, the heat transfer rate between the electrical components and the air increases, which dissipates more heat from the component possibly allowing more powerful components or components to operate at higher utilization without reaching the TJ limit. One important factor in dissipating heat from a component, such as a heatpipe, is lowering its thermal resistance (i.e., how much it resists transfer of heat), which is defined by the following equation:

$$R_{th} = 1/hA,$$

where $R_{th}$ is the thermal resistance, h is the heat transfer coefficient and A is area. The air flow generated by the second fan and/or fan with a second outlet increases the heat transfer coefficient, h, but without an increase in area, A, of such air flow across the component, its impact on the thermal resistance, $R_{th}$, will be limited. Providing an additional heat exchanger will increase the area of such air flow across the component, thereby lowing its thermal resistance and increasing heat dissipation. However, as will be appreciated, without meaningful air flow across the component, increasing its area will not meaningfully lower its thermal resistance.

In some systems, for example, where the additional heat exchanger is positioned near the chassis body, such additional heat exchanger may transfer its heat to the chassis body, thereby increasing the temperature of the chassis body. So long as such increase does not reach the skin limit, the additional heat exchanger will optimally permit increased performance of the information handling system (i.e., the system will still be TJ limited). If, however, such additional heat exchanger results in heat transfer to the chassis body that exceeds the skin limit, then such additional heat exchanger may inefficiently constrain the performance of the information handling system. In such case, the additional heat exchanger may be modified (e.g., reduced in size) until the system is again TJ limited. The size of the additional heat exchanger may depend in part on the space between the chassis body and the electrical components to which it is coupled. The greater such space, generally the greater the permitted size (and efficacy) of the additional heat exchanger.

According to one embodiment, there is an apparatus comprising an electrical component of an information handling system, such as a central processing unit or a graphics processing unit. The IHS component may be in direct physical and thermal contact with a first portion of a heat pipe such that the heat pipe may receive heat generated by the component by conduction. The first portion of the heat pipe may also be in direct physical and thermal contact with a heat exchanger, such as a fin stack, such that the heat exchanger may receive heat from the heat pipe by conduction. A blower system, such as fan, may be configured to drive a first quantity of air (or a portion of it) across the first exchanger to cool it by convection. The fan may also drive the first quantity of air (or a portion of it) directly across the heat pipe and electrical component, as well as other electrical components or non-heat generating components of the IHS, including the IHS chassis. The fan may include one or more outlets configured to discharge air from the fan and the first heat exchanger may be positioned away from each of the fan outlets in the IHS chassis.

The heat exchanger may be configured to occupy (e.g., substantially fill) the space between the surface of the heat pipe with which it is in direct physical contact and the interior surface of the IHS chassis. Such a configuration will increase the surface area of the heat exchanger that contacts the first quantity of air, thereby increasing the rate of heat transfer from the heat exchanger (and therefore also from the electrical component) to the air.

The heat pipe may also include a second portion that is not in direct physical contact with the electrical component, but is in thermal contact with the electrical component and the first portion of the heat pipe. The second portion may be in direct physical contact with a second heat exchanger, such as a fin stack, and the fan may drive a second portion of the air across the second heat exchanger and/or the second portion of the heat pipe to cool them by convection, which may also increase the heat transfer from the electrical component to the air. In some embodiments, the blower system/fan is a dual opposite outlet fan (a "DOO fan"), such as that disclosed and described in U.S. Pat. No. 10,584,717, which is incorporated by reference herein. A DOO fan may improve efficiency by having multiple thin fan blades that are relatively larger than the fan body. Additionally, DOO fans include two outlets, rather than just one, which allows the fan to include a large fan impeller. Alternatively or additionally, a second blower system/fan may be included in the IHS and drive a quantity of air across the additional heat exchanger and/or the second portion of the heat pipe to cool them by convection, which may also increase the heat transfer from the electrical component to the air.

In some embodiments, the air (including a first quantity and/or second quantity) may be discharged from the IHS chassis through one or more outlets in the IHS chassis (after having cooled the electrical component, heat pipe, first heat exchanger, additional heat exchanger, and/or other IHS components (e.g., the IHS chassis, other electrical components) by convection).

According to some aspects of the disclosure, a method for assembling an information handling system includes attaching a printed circuit board to a chassis of the information handling system, wherein the printed circuit board includes one or more electrical components. Some of those electrical components may generate enough heat to require active cooling. For one or more of such electrical components, assembly of the information handling system may include coupling a first portion of a heat pipe to the electrical component and to be vertically aligned with the electrical component, and coupling a heat exchanger comprising a plurality of fins that may extend through the space between the electrical component and heat pipe and a surface of the chassis. The method may further include coupling at least one fan, such as a DOO fan, into the chassis of the information handling system in a manner that allows the fan to drive air towards the heat exchanger, such that when the information handling system is on and other preprogrammed criteria are met, the fan will turn on and cool the electrical component through heat exchange from heat pipe to the heat exchanger to the air driven through the chassis by the fan.

As used herein, the term "coupled" means connected, although not necessarily directly, and not necessarily mechanically; two items that are "coupled" may be unitary with each other. The terms "a" and "an" are defined as one or more unless this disclosure explicitly requires otherwise. The term "substantially" is defined as largely but not necessarily wholly what is specified (and includes what is specified; e.g., substantially parallel includes parallel), as understood by a person of ordinary skill in the art.

The phrase "and/or" means "and" or "or". To illustrate, A, B, and/or C includes: A alone, B alone, C alone, a combination of A and B, a combination of A and C, a combination of B and C, or a combination of A, B, and C. In other words, "and/or" operates as an inclusive or.

Further, a device or system that is configured in a certain way is configured in at least that way, but it can also be configured in other ways than those specifically described.

The terms "comprise" (and any form of comprise, such as "comprises" and "comprising"), "have" (and any form of have, such as "has" and "having"), and "include" (and any form of include, such as "includes" and "including") are open-ended linking verbs. As a result, an apparatus or system that "comprises," "has," or "includes" one or more elements possesses those one or more elements, but is not limited to possessing only those elements. Likewise, a method that "comprises," "has," or "includes," one or more steps possesses those one or more steps, but is not limited to possessing only those one or more steps.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings. Elements within each FIGURE are generally drawn to scale relative to other elements in the same FIGURE.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
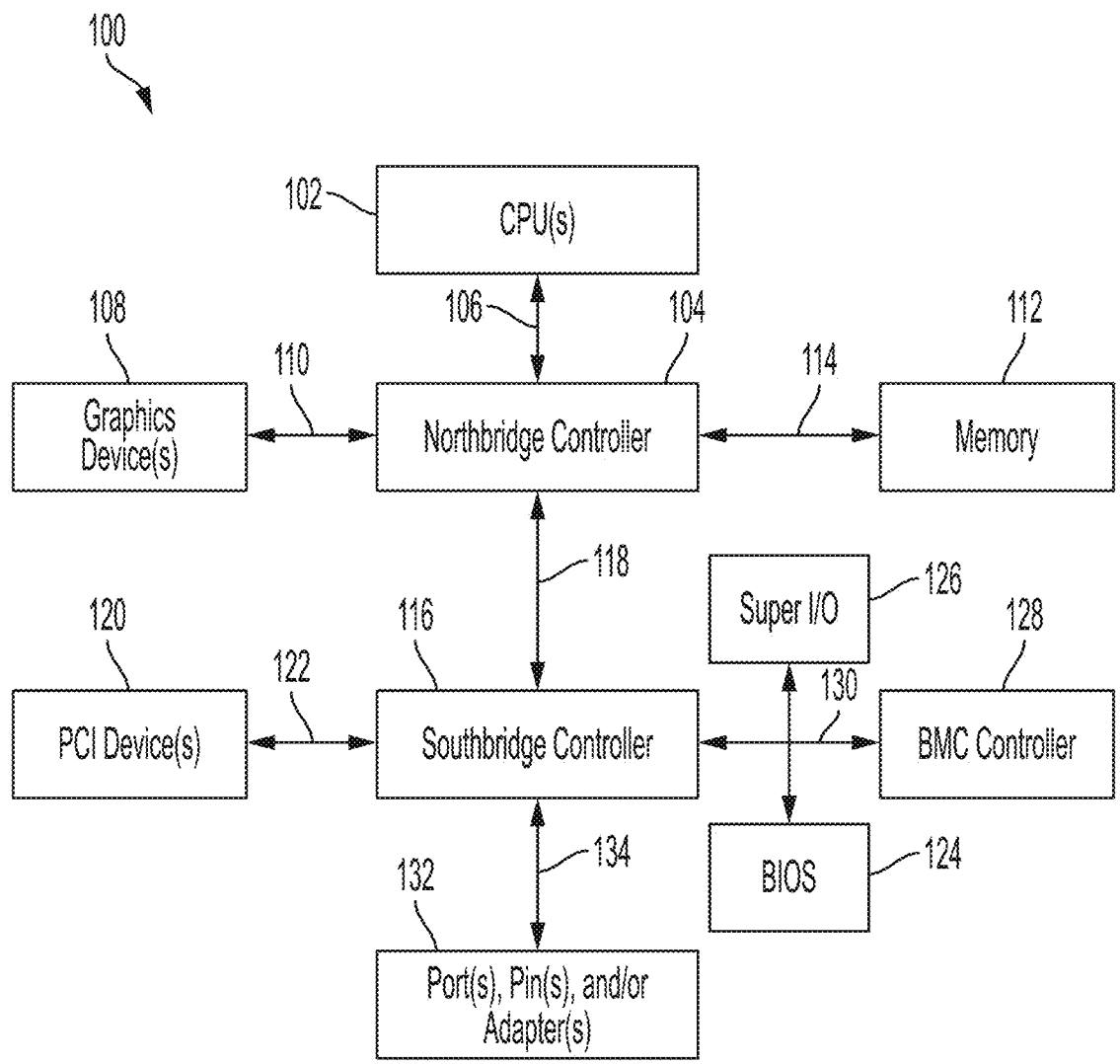
FIG. 1 is a schematic block diagram of an example information handling system according to some embodiments of the disclosure.

An information handling system may include a variety of components to generate, process, display, manipulate, transmit, and receive information. One example of an information handling system 100 is shown in FIG. 1. IHS 100 may include one or more central processing units (CPUs) 102. In some embodiments, IHS 100 may be a single-processor system with a single CPU 102, while in other embodiments IHS 100 may be a multi-processor system including two or more CPUs 102 (e.g., two, four, eight, or any other suitable number). CPU(s) 102 may include any processor capable of executing program instructions. For example, CPU(s) 102 may be processors capable of implementing any of a variety of instruction set architectures (ISAs), such as the x86, POWERPC®, ARM®, SPARC®, or MIPS® ISAs, or any other suitable ISA. In multi-processor systems, each of CPU(s) 102 may commonly, but not necessarily, implement the same ISA.

CPU(s) 102 may be coupled to northbridge controller or chipset 104 via front-side bus 106. The front-side bus 106 may include multiple data links arranged in a set or bus configuration. Northbridge controller 104 may be configured to coordinate I/O traffic between CPU(s) 102 and other components. For example, northbridge controller 104 may be coupled to graphics device(s) 108 (e.g., one or more video cards or adaptors, etc.) via graphics bus 110 (e.g., an Accelerated Graphics Port or AGP bus, a Peripheral Component Interconnect or PCI bus, etc.). Northbridge controller 104 may also be coupled to system memory 112 via memory bus 114. Memory 112 may be configured to store program instructions and/or data accessible by CPU(s) 102. In various embodiments, memory 112 may be implemented using any suitable memory technology, such as static RAM (SRAM), synchronous dynamic RAM (SDRAM), nonvolatile/Flash-type memory, or any other type of memory.

Northbridge controller 104 may be coupled to southbridge controller or chipset 116 via internal bus 118. Generally, southbridge controller 116 may be configured to handle various of IHS 100's I/O operations, and it may provide interfaces such as, for instance, Universal Serial Bus (USB), audio, serial, parallel, Ethernet, etc., via port(s), pin(s), and/or adapter(s) 132 over bus 134. For example, southbridge controller 116 may be configured to allow data to be exchanged between IHS 100 and other devices, such as other IHS s attached to a network. In various embodiments, southbridge controller 116 may support communication via wired or wireless data networks, such as any via suitable type of Ethernet network, via telecommunications/telephony networks such as analog voice networks or digital fiber communications networks, via storage area networks such as Fiber Channel SANs, or via any other suitable type of network and/or protocol.

Southbridge controller 116 may also enable connection to one or more keyboards, keypads, touch screens, scanning devices, voice or optical recognition devices, or any other devices suitable for entering or retrieving data. Multiple I/O devices may be present in IHS 100. In some embodiments, I/O devices may be separate from IHS 100 and may interact with IHS 100 through a wired or wireless connection. As shown, southbridge controller 116 may be further coupled to one or more PCI devices 120 (e.g., modems, network cards, sound cards, video cards, etc.) via PCI bus 122. Southbridge controller 116 may also be coupled to Basic I/O System (BIOS) 124, Super I/O Controller 126, and Baseboard Management Controller (BMC) 128 via Low Pin Count (LPC) bus 130.

IHS 100 may be configured to access different types of computer-accessible media separate from memory 112. Generally speaking, a computer-accessible medium may include any tangible, non-transitory storage media or memory media such as electronic, magnetic, or optical media, including a magnetic disk, a hard drive, a CD/DVD-ROM, and/or a Flash memory. Such mediums may be coupled to IHS 100 through various interfaces, such as universal serial bus (USB) interfaces, via northbridge controller 104 and/or southbridge controller 116. Some such mediums may be coupled to the IHS through a Super I/O Controller 126 combines interfaces for a variety of lower bandwidth or low data rate devices. Those devices may include, for example, floppy disks, parallel ports, keyboard and mouse and other user input devices, temperature sensors, and/or fan speed monitoring.

BIOS 124 may include non-volatile memory having program instructions stored thereon. The instructions stored on the BIOS 124 may be usable by CPU(s) 102 to initialize and test other hardware components. The BIOS 124 may further include instructions to load an Operating System (OS) for execution by CPU(s) 102 to provide a user interface for the IHS 100, with such loading occurring during a pre-boot stage. In some embodiments, firmware execution facilitated by the BIOS 124 may include execution of program code that is compatible with the Unified Extensible Firmware Interface (UEFI) specification, although other types of firmware may be used.

BMC controller 128 may include non-volatile memory having program instructions stored thereon that are usable by CPU(s) 102 to enable remote management of IHS 100. For example, BMC controller 128 may enable a user to discover, configure, and/or manage BMC controller 128. Further, the BMC controller 128 may allow a user to setup configuration options, resolve and administer hardware or software problems, etc. Additionally or alternatively, BMC controller 128 may include one or more firmware volumes, each volume having one or more firmware files used by the BIOS firmware interface to initialize and test components of IHS 100.

One or more of the devices or components shown in FIG. 1 may be absent, or one or more other components may be added. Further, in some embodiments, components may be combined onto a shared circuit board and/or implemented as a single integrated circuit (IC) with a shared semiconductor substrate. For example, northbridge controller 104 may be combined with southbridge controller 116, and/or be at least partially incorporated into CPU(s) 102. Accordingly, systems and methods described herein may be implemented or executed with other computer system configurations. In some cases, various elements shown in FIG. 1 may be mounted on a motherboard and enclosed within a chassis of the IHS 100.

Figure 2:
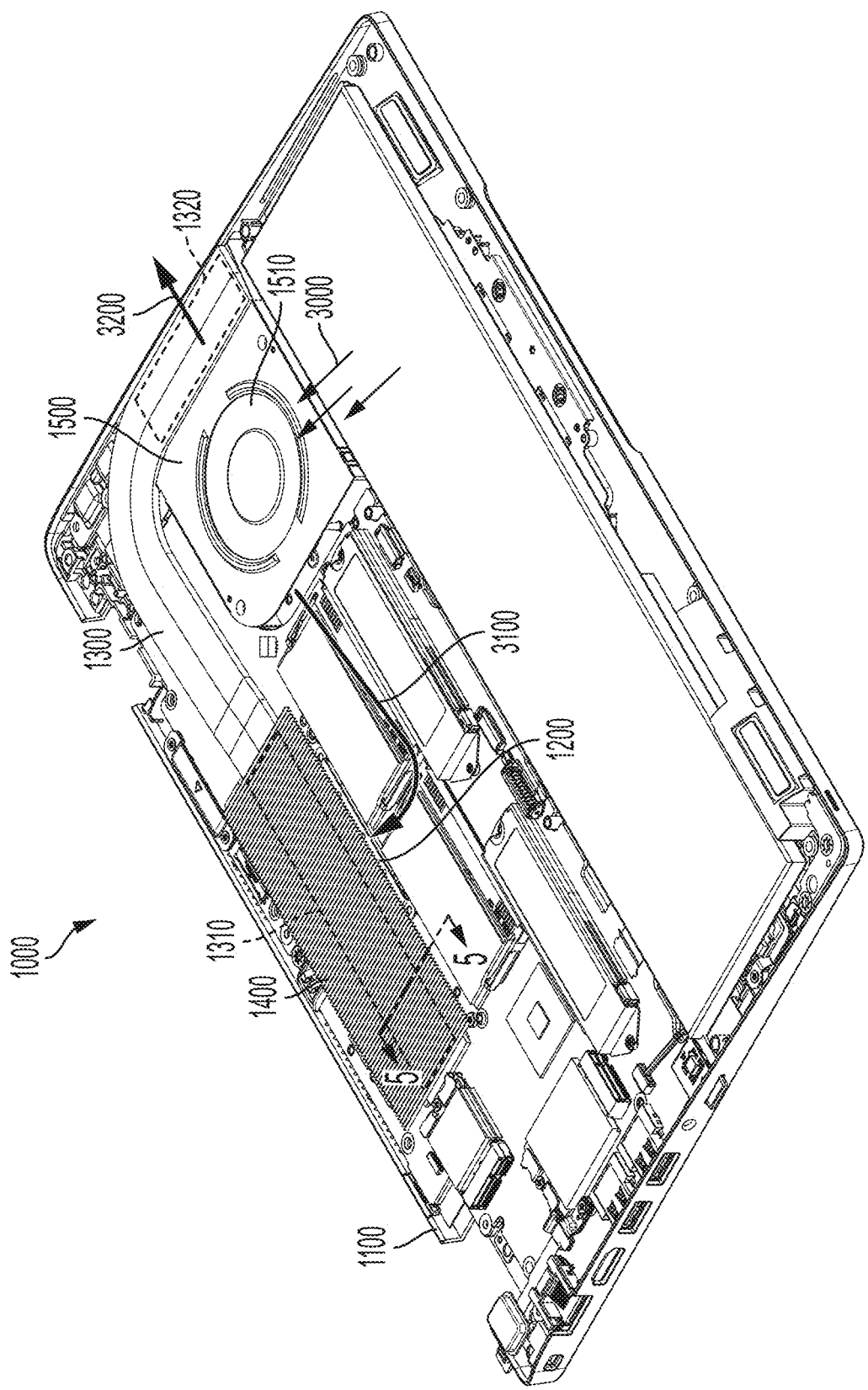
FIG. 2 is a bottom perspective view of a partially disassembled (e.g., without a bottom cover) exemplary information handling system according to some embodiments of the disclosure.
Figure 5:
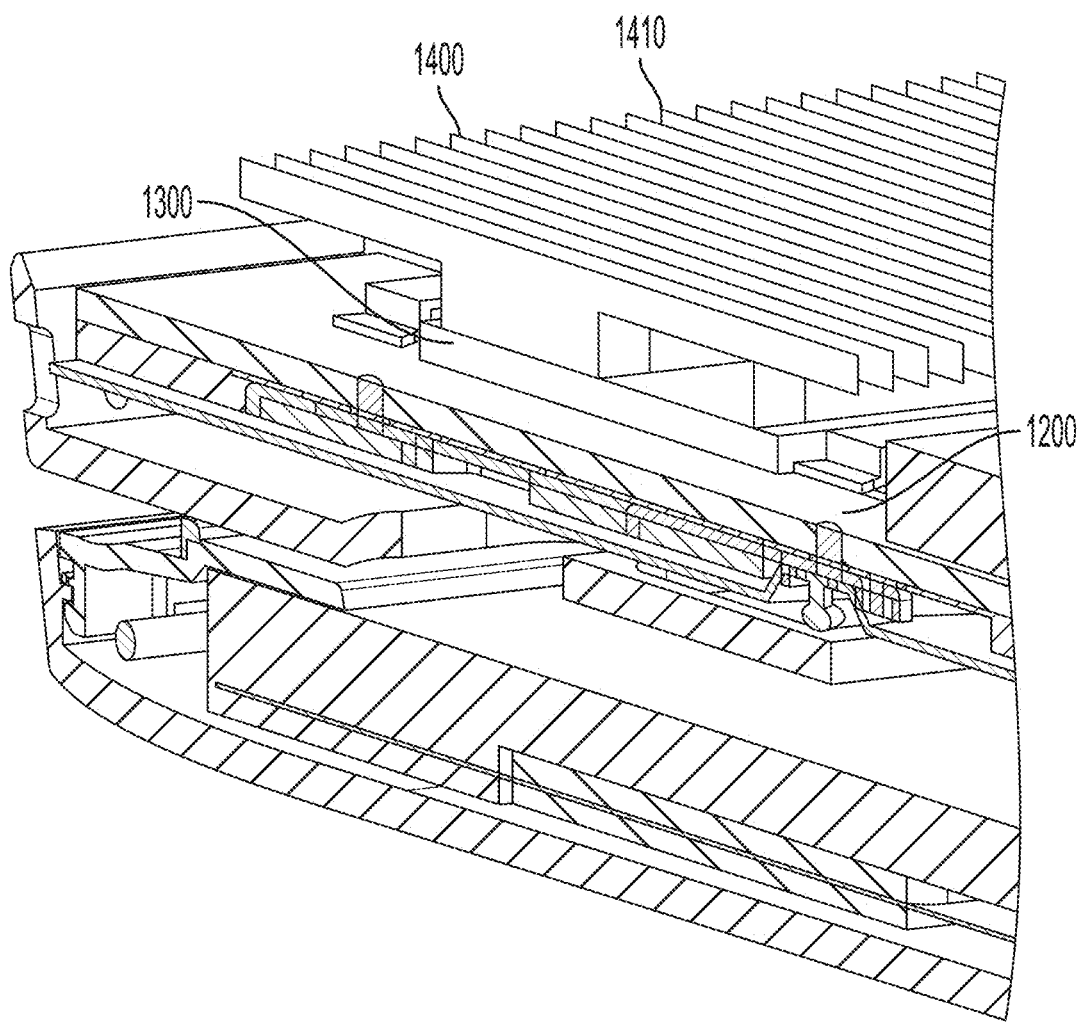
FIG. 5 is a cross-sectional perspective view of a portion of the exemplary information handling system of FIG. 2 along line A-A.

FIG. 2 depicts an IHS 1000 having a chassis 1100, an electrical (e.g., heat-generating) component 1200, a heat pipe 1300, a heat exchanger 1400, and a DOO fan 1500. The component 1200 may be, for example, a central processing unit or a graphics processing unit or any other components of the IHS that generates heat during operation. As shown more clearly in FIG. 5, the component 1200 is in direct physical contact (e.g., directly physically coupled) above and with a first portion 1310 of heat pipe 1300 such that generated heat is transferred from component 1200 to first portion 1310 of heat pipe 1300 by conduction. Heat exchanger 1400 is in direct physical contact with the first portion 1310 of heat pipe 1300 such that some generated heat transferred to first portion 1310 is transferred to heat exchanger 1400 by conduction. Heat exchanger 1400 is a fin stack with a large surface area having several parallel fins 1410, though it is to be understood that heat exchanger 1400 could be in a different form, including a fin stack have differently configured and shaped fins. Heat exchanger component 1400 may be aligned vertically with (e.g., over) the electrical component 1200 and/or be aligned along a different horizontal axis or plane from fan 1500 and/or an air discharge outlet thereof. Heat exchanger component 1400 may be positioned not adjacent to a cooling fan or the air flow outlet of a cooling fan. As shown in FIG. 2, heat exchanger 1400 is positioned vertically over electrical component 1200 and not adjacent to the locations where air flows out of DOO fan 1500. As such, the location of heat exchanger 1400 may be not dependent on the location of the cooling fan(s) of an IHS cooling system. Rather, the location of heat exchanger 1400 may be dependent on the location of the electrical component 1200 and portion 1310 of heat pipe directly contacting that electrical component 1200. This permits more freedom in arranging IHS components in a chassis to optimize chassis space and IHS component functions.

Figure 6:
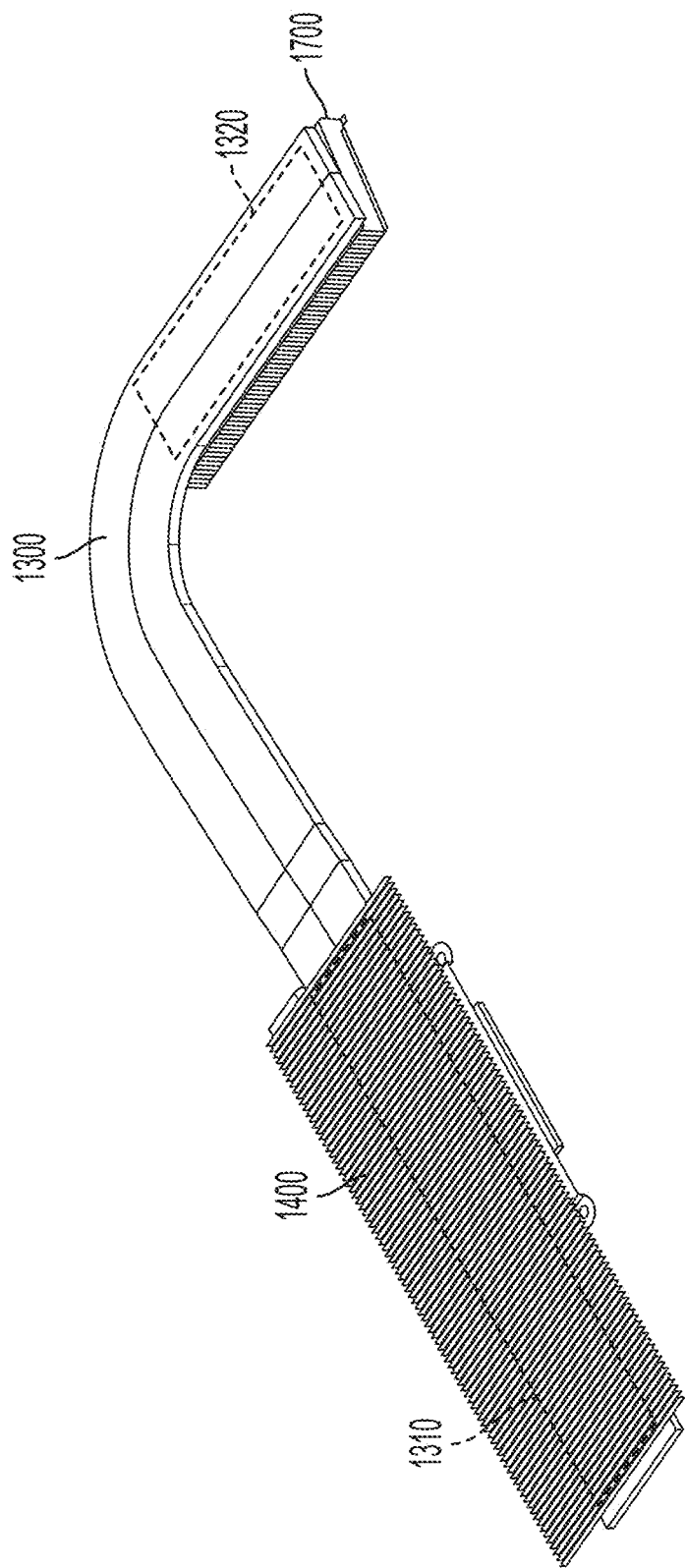
FIG. 6 is a top perspective view of the configuration of the heat pipe 1300, heat exchanger 1400, and heat exchanger 1700 of exemplary information handling system 1000 of FIG. 2.

As shown in FIG. 2, heat pipe 1300 also includes a second portion 1320 that is in thermally-conductive contact with the first portion 1310 and indirectly physically contacts component 1200 (i.e., through first portion 1310) such that some generated heat transferred to first portion 1310 is also transferred to second portion 1320 by conduction. As shown in FIG. 6, a second heat exchanger 1700 is positioned on the bottom of second portion 1320 such that some of the generated heat transferred to second portion 1320 is transferred to heat exchanger 1700 by conduction. Heat exchanger 1700 is a fin stack with a large surface area having a number of parallel fins similar to heat exchanger 1400, though it is to be understood that heat exchanger 1700 could in a different form, including a fin stack have differently configured and shaped fins.

Figure 3:
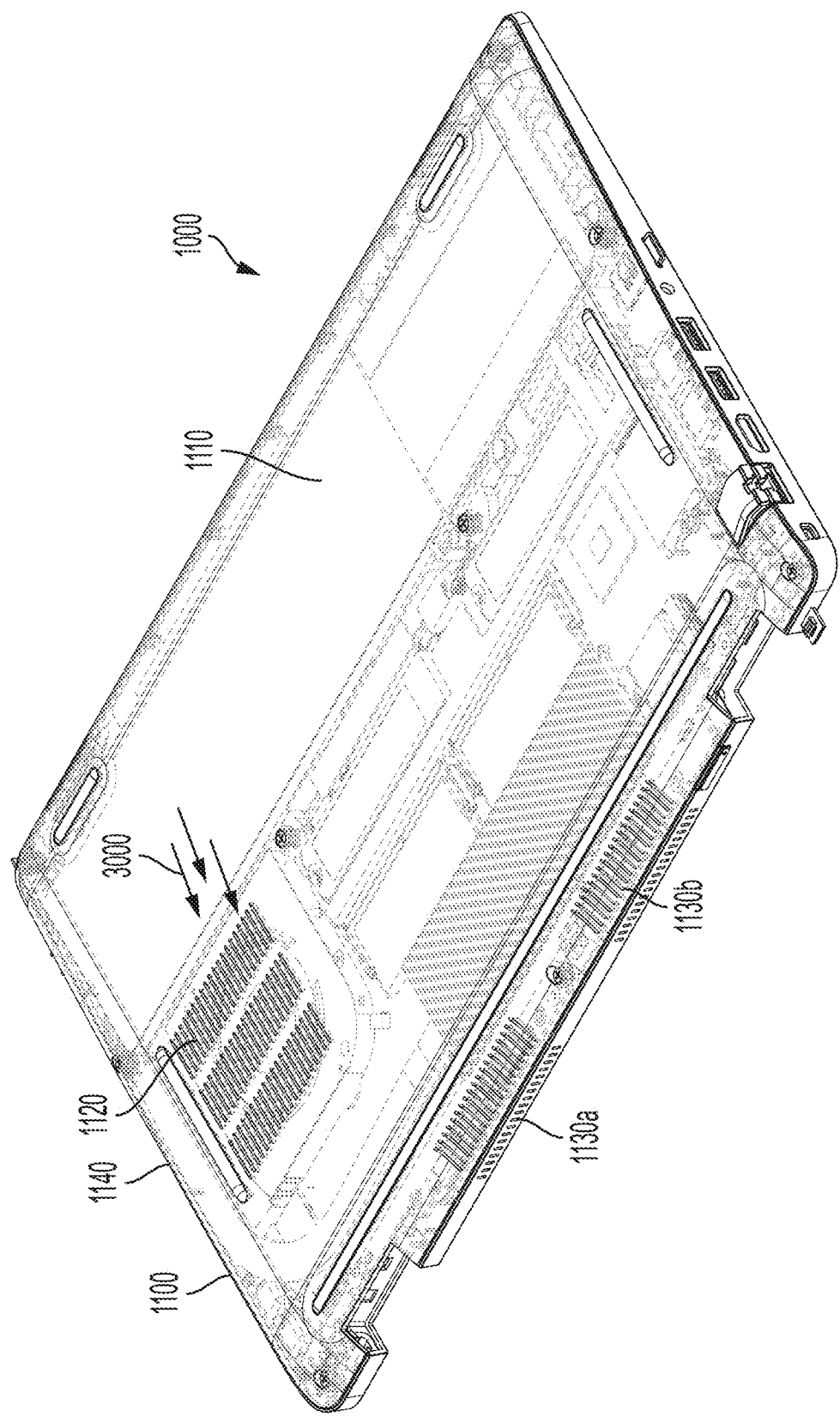
FIG. 3 is a bottom partially transparent perspective view of the exemplary information handling system of FIG. 2.

During operation of IHS 1000, component 1200 generates heat. It is desirable to dissipate at least a portion of that heat to, for example, prevent over-heating of component 1200. The method to dissipate that heat will now be explained. Fan 1500 is operated to receive a quantity of air 3000 through its inlet 1510. If the back cover 1110 of IHS chassis 1100 is in position (as shown in FIG. 3), then air 3000 first passes through inlets 1120 in IHS chassis 1100 before being received inlet 1510. Fan 1500 then drives a portion 3100 of the air 3000 directly across components of IHS 1000, including component 1200 and the body of chassis 1100, to cool those components by convection (i.e., by replacing hotter air near the components with the cooler air 3000 such that the rate of heat transfer from the components increases). Fan 1500 also drives air 3100 across heat pipe 1300, including first portion 1310, and across heat exchanger 1400, to cool these components by convection thereby increasing the conductive heat transfer rate between component 1200 and heat pipe 1300 and between first portion 1310 and heat exchanger 1400. After air 3100 passes across (and is heated by) these components, it is discharged through one or more outlets in the IHS chassis 1100, such as outlets 1130a, 1130b (which may also be integral).

Fan 1500, as, for example, a DOO fan, also drives a second portion 3200 of air 3000 in a different (e.g., an opposite) direction as the direction air 3100 was driven such that air 3100 is driven across second portion 1320 of heat pipe 1300 and/or heat exchanger 1700 to cool second portion 1320 and heat exchanger 1700 by convection. Cooling second portion 1320 also cools first portion 1310 by increasing the heat transfer rate between them, which in turn further cools component 1200 by increasing the heat transfer rate between component 1200 and first portion 1310. After air 3200 passes across (and is heated by) portion 1320 and/or the heat exchanger 1700, it is discharged through one or more outlets in the IHS chassis 1100, such as an outlet positioned on side 1140 (not shown).

Including heat exchanger 1400 in IHS 1000 can reduce the temperature of heat pipe 1300 and component 1200 by more than 3.5% of its otherwise normal operating temperature, including between 3.5% and 4.5%. For example, with the inclusion of heat exchanger 1400, the temperature of heat pipe 1300 can be lowered by about 3.3 degrees Celsius from about 77.8 degrees Celsius to about 74.5

Celsius. Similarly, the inclusion of heat exchanger 1400 can lower the temperature of component 1200 (e.g., a GPU) by about 3.3 degrees Celsius from about 85.3 degrees Celsius to about 82.0 degrees Celsius. However, including heat exchanger 1400 in IHS 1000 may also slightly increase the temperature of the back cover 1110 of IHS chassis 1100 by more than 0.5%, including about 0.6%, of its normal temperature during operation of IHS 1000. For example, with the inclusion of heat exchanger 1400, the temperature of back cover 1110 may be increased by 0.3 degrees Celsius from about 49.8 degrees Celsius to about 50.1 degrees Celsius.

Figure 4:
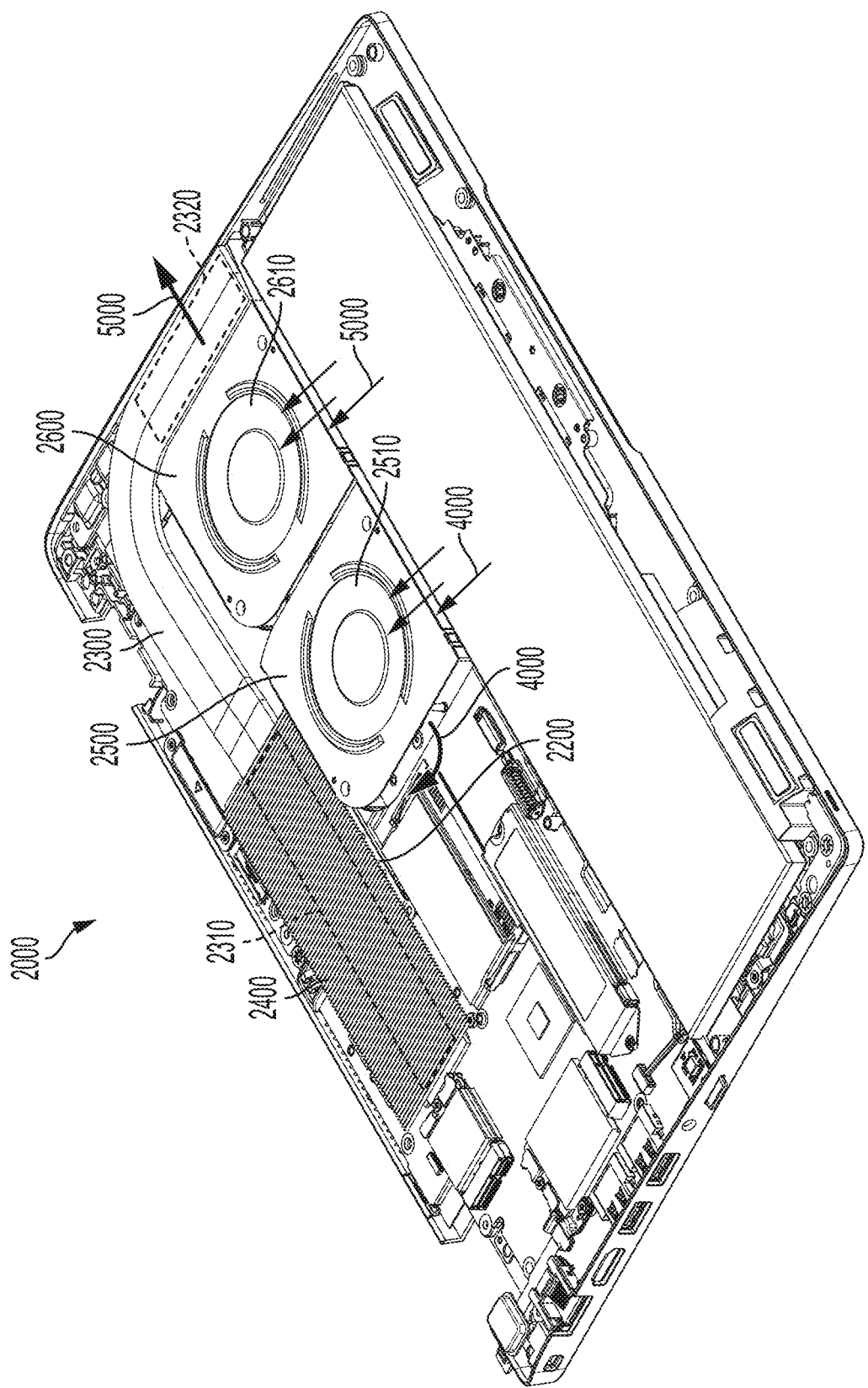
FIG. 4 is a bottom perspective view of another partially disassembled (e.g., without a bottom cover) exemplary information handling system according to some embodiments of the disclosure.

In another embodiment, a second fan may be employed instead of or in addition to DOO fan 1500. For example, an IHS 2000 is shown in FIG. 4 that is substantially the same as IHS 1000, except as follows. IHS 2000 includes a first fan 2500 and a second fan 2600. During operation of IHS 2000, component 2200 (e.g., a CPU or GPU) generates heat. Fan 2500 is operated to receive a first quantity of air 4000 through its inlet 2510. Fan 2500 then drives air 4000 directly across components of IHS 1000, including component 2200 and the body of the chassis of IHS 2000, to cool those components by convection (i.e., by replacing hotter air near the components with the cooler air 4000 such that the rate of heat transfer from the components increases). Fan 2500 also drives air 4000 across heat pipe 2300, including first portion 2310, and across heat exchanger 2400, to cool these components by convection thereby increasing the conductive heat transfer rate between component 2200 and heat pipe 2300 and between first portion 2310 and heat exchanger 2400. After air 4000 passes across (and is heated by) these components, it is discharged through one or more outlets in the IHS chassis.

Fan 2600 is operated to receive a second quantity of air 5000 through its inlet 2610. Fan 2600 then drives air 5000 in a different (e.g., an opposite) direction as the direction air 4000 was driven by fan 2500 such that air 5000 is driven across second portion 2320 of heat pipe 2300 and/or second heat exchanger 2700 (not shown), which is in direct physical contact with the bottom of second portion 2320, to cool second portion 2320 and heat exchanger 2700 by convection. Cooling second portion 2320 also cools first portion 2310 by increasing the heat transfer rate between them, which in turn further cools component 2200 by increasing the heat transfer rate between component 2200 and first portion 2310. After air 5000 passes across (and is heated by) portion 2320 and/or second heat exchanger 2700, it is discharged through one or more outlets in the IHS chassis.

Figure 7:
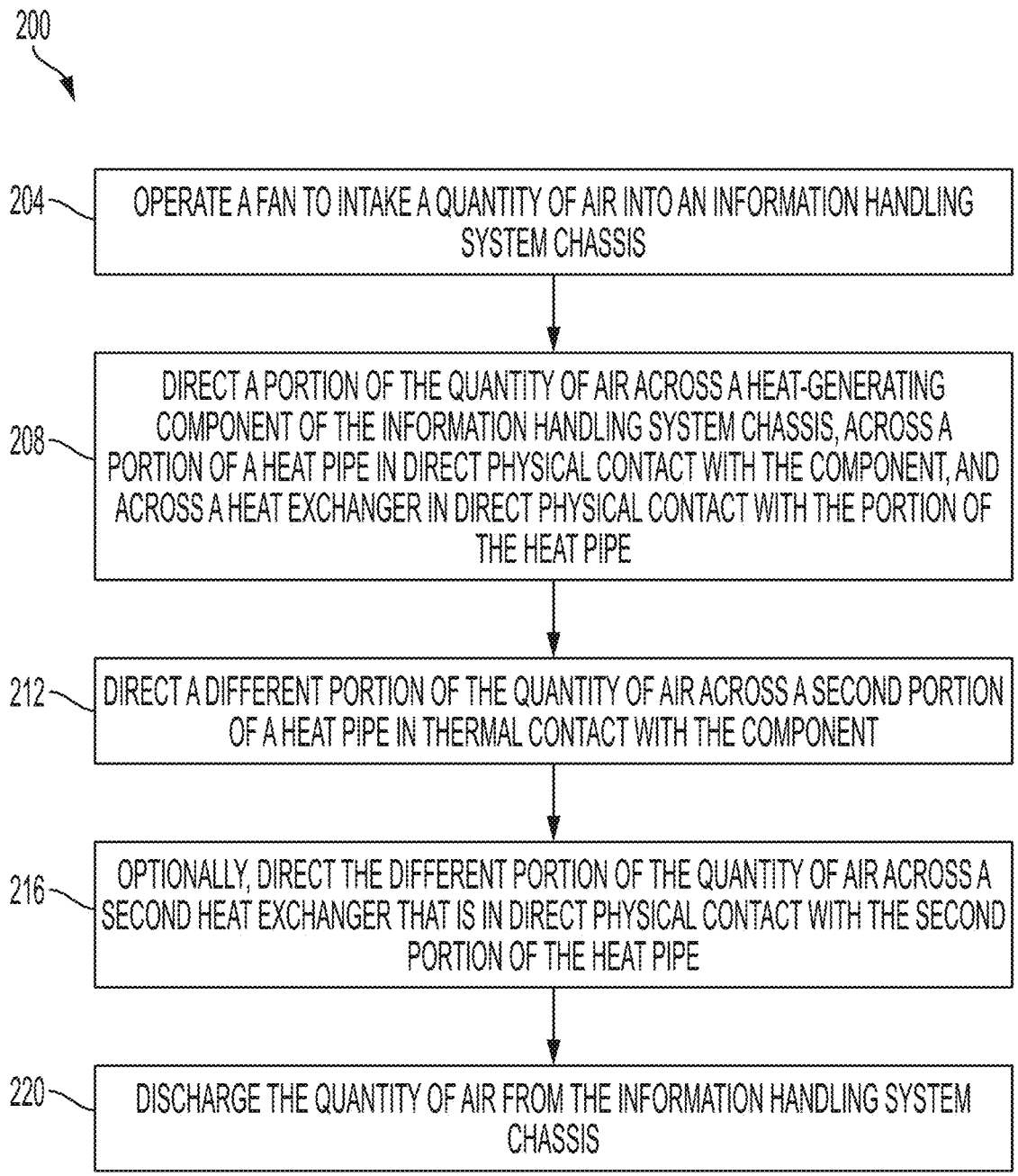
FIG. 7 is a flow chart illustrating a method for cooling components of an information handling system according to some embodiments of the disclosure.

Turning now to FIG. 7, which is a flow chart illustrating an exemplary method 200 of cooling components of an information handling system. In first step 204, a fan of the IHS is operated to intake a quantity of air into an IHS chassis. The air may be received through an inlet in the fan and it may first pass through inlets in the body of the IHS chassis. In step 208, the fan is operated to direct a first portion of the air across an electrical (i.e., heat-generating) component of the IHS, such as, for example, a central processing unit and/or a graphics processing unit. The air can also be directed across other components of the IHS, including those that don't generate heat like the IHS chassis body. The first portion of air is also directed by the fan in step 208 across a first portion of a heat pipe that is in direct physical contact with the electrical component as well as across a heat exchanger that is in direct physical contact with the first portion of the heat pipe. In step 212, the fan is operated to direct a different, second portion of the air across a second portion of the heat pipe that is only in indirect physical contact with the electrical component but is also in thermal contact with the electrical component. At step 216, the fan may be optionally operated to also direct the second, different portion of air across a second heat exchanger that is in direct physical contact with the second portion of the heat pipe. At step 220, the fan is operated to discharge the quantity of air from the IHS chassis, for example, through one or more outlets in the IHS chassis body.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An apparatus, comprising:
    an electrical component of an information handling system;
    a heat pipe having a first portion positioned vertically above the electrical component, the first portion in thermal contact with the electrical component;
    a first heat exchanger positioned vertically above the electrical component, the first heat exchanger in thermal contact with the first portion of the heat pipe; and
    a first fan having a first outlet configured to drive air within a chassis of the information handling system to the first heat exchanger and through a first chassis outlet positioned on a perimeter of the chassis;
    wherein:
        the first heat exchanger is aligned along a different axis from the first outlet of the first fan; and
        the electrical component is positioned closer to the perimeter than is the first fan.

2. The apparatus of claim 1, wherein the electrical component is at least one of a central processing unit and a graphics processing unit.

3. The apparatus of claim 1, wherein:
    the first heat exchanger is a fin stack;
    the first fan is configured to drive air from the first outlet along a first flow path such that the air traveling along the first flow path travels a first distance from the first outlet to the first heat exchanger and a second distance from the first heat exchanger to the first chassis outlet; and
    the first distance is greater than the second distance.

4. The apparatus of claim 1, wherein the first heat exchanger is laterally spaced away from a first axis that is aligned with and intersects the first outlet of the first fan.

5. The apparatus of claim 4, further comprising:
    a second heat exchanger in thermal contact with a second portion of the heat pipe,
    wherein the second portion of the heat pipe is in thermal contact with the electrical component and the first portion of the heat pipe.

6. The apparatus of claim 5, wherein the first fan has the first outlet and a second outlet, the first and second outlets configured to discharge air in two different directions along the first axis.

7. The apparatus of claim 5, further comprising a second chassis outlet positioned on the perimeter of the chassis, wherein the first chassis outlet and the second chassis outlet are configured to discharge air from the chassis.

8. The apparatus of claim 1, further comprising:
a second heat exchanger in direct physical contact with a second portion of the heat pipe positioned adjacent to a second fan,
wherein the second fan is configured to drive air across the second heat exchanger, and
wherein the second portion of the heat pipe is in thermal contact with the electrical component and the first portion of the heat pipe.

9. The apparatus of claim 8, wherein the second heat exchanger is a fin stack and wherein the first fan is configured to drive air from the first outlet to the first heat exchanger in a direction away from the second fan.

10. The apparatus of claim 8, further comprising a second chassis outlet, wherein the first chassis outlet and the second chassis outlet are configured to discharge air from the chassis.

11. A method, comprising:
driving air from a first outlet of a first fan along a first flow path across a chassis of an information handling system to dissipate heat off a first heat exchanger and out of a first chassis outlet,
wherein:
the driven air along the first flow path passes from the first heat exchanger to the first chassis outlet without passing through an additional fan;
the first heat exchanger is positioned vertically above and in thermal contact with a first portion of a heat pipe;
the first portion of the heat pipe is positioned vertically above an electrical component of the information handling system and in thermal contact with the electrical component; and
the first heat exchanger is aligned along a different axis from the first outlet of the first fan.

12. The method of claim 11, wherein the first heat exchanger is laterally spaced from a first axis that is aligned with and intersects the first outlet of the first fan.

13. The method of claim 11, wherein driving the air lowers the temperature of the electrical component by at least three degrees Centigrade.

14. The method of claim 11, wherein driving the air raises the temperature of the chassis housing the electrical component by less than it lowers the temperature of the electrical component.

15. The method of claim 11, further comprising:
driving air across a second heat exchanger,
wherein the second heat exchanger is in thermal contact with the electrical component and direct physical contact with a second portion of the heat pipe, the second portion positioned adjacent to a first fan.

16. The method of claim 15, wherein driving the air across the second heat exchanger comprises driving the air with the first fan.

17. The method of claim 16, wherein the first fan has the first outlet and a second outlet, the first and second outlets configured to discharge air in two different directions along a first axis.

18. An information handling system, comprising:
a chassis having:
a perimeter that includes a first side and a second side,
a first outlet positioned on the first side and configured to discharge air from the chassis
a second outlet positioned on the second side and configured to discharge air from the chassis;
an electrical component within the chassis;
a heat pipe having a first portion and a second portion, the first portion positioned vertically above and in thermal contact with the electrical component and the second portion in thermal contact with the electrical component and the first portion of the heat pipe;
a first heat exchanger positioned vertically above and in thermal contact with the first portion of the heat pipe;
a second heat exchanger in thermal contact with the second portion of the heat pipe; and
a fan configured to drive air within the chassis,
wherein:
the electrical component is disposed between the first side of the perimeter and the fan;
the fan includes a first outlet configured to discharge air along a first path and a second outlet configured to discharge air along a second path;
the first path extends from the first outlet of the fan, to the first heat exchanger, to the first outlet on the first side of the chassis; and
the second path extends from the second outlet of the fan, to the second heat exchanger, to the second outlet on the second side of the chassis.

19. The information handling system of claim 18, wherein the electrical component is at least one of a central processing unit and a graphics processing unit.

20. The information handling system of claim 18, wherein:
the first outlet of the fan, the second outlet of the fan, the second heat exchanger, and the second outlet of the chassis are positioned along a first axis; and
the first heat exchanger is positioned along a second axis that is parallel to the first axis.

* * * * *